(12) United States Patent
Minoda

(10) Patent No.: US 8,305,560 B2
(45) Date of Patent: Nov. 6, 2012

(54) EXPOSURE APPARATUS, DEVICE MANUFACTURING METHOD, AND APERTURE STOP MANUFACTURING METHOD

(75) Inventor: Ken Minoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 701 days.

(21) Appl. No.: 12/484,850

(22) Filed: Jun. 15, 2009

(65) Prior Publication Data

US 2009/0311636 A1 Dec. 17, 2009

(30) Foreign Application Priority Data

Jun. 16, 2008 (JP) ................... 2008-156075

(51) Int. Cl.
*G03B 27/72* (2006.01)
*G03B 27/54* (2006.01)

(52) U.S. Cl. ............................ 355/71; 355/67
(58) Field of Classification Search .............. 355/67, 355/71; 359/227

See application file for complete search history.

(56) References Cited

U.S. PATENT DOCUMENTS

| 5,253,040 A * | 10/1993 | Kamon et al. | 356/399 |
| 5,335,044 A * | 8/1994 | Shiraishi | 355/53 |
| 5,396,311 A * | 3/1995 | Fukushima et al. | 355/71 |
| 6,281,964 B1 * | 8/2001 | Sato | 355/53 |
| 6,654,101 B2 * | 11/2003 | Suzuki et al. | 355/53 |
| 2006/0192935 A1 * | 8/2006 | Hansen et al. | 355/69 |
| 2006/0244941 A1 * | 11/2006 | Gruner et al. | 355/69 |
| 2007/0115449 A1 * | 5/2007 | Dierichs et al. | 355/68 |
| 2008/0259307 A1 * | 10/2008 | Arai et al. | 355/71 |
| 2009/0004581 A1 * | 1/2009 | Fukuhara et al. | 430/30 |

FOREIGN PATENT DOCUMENTS

| JP | 5-315226 A | 11/1993 |
| JP | 2005-268237 A | 9/2005 |
| JP | 2007-080947 A | 3/2007 |
| KR | 2002-0000654 A | 1/2002 |

* cited by examiner

*Primary Examiner* — Hung Henry Nguyen
*Assistant Examiner* — Steven H Whitesell Gordon
(74) *Attorney, Agent, or Firm* — Canon USA Inc IP Division

(57) ABSTRACT

A projection exposure apparatus includes an aperture stop that includes a light attenuation part that is located between a light shielding part and an opening part, and has a transmittance larger than that of the light shielding part and smaller than that of the opening part. A width of the light attenuation part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and Z is a distance between the focal plane of the wavefront splitting device on the exit side and the aperture stop.

15 Claims, 12 Drawing Sheets

PRIOR ART

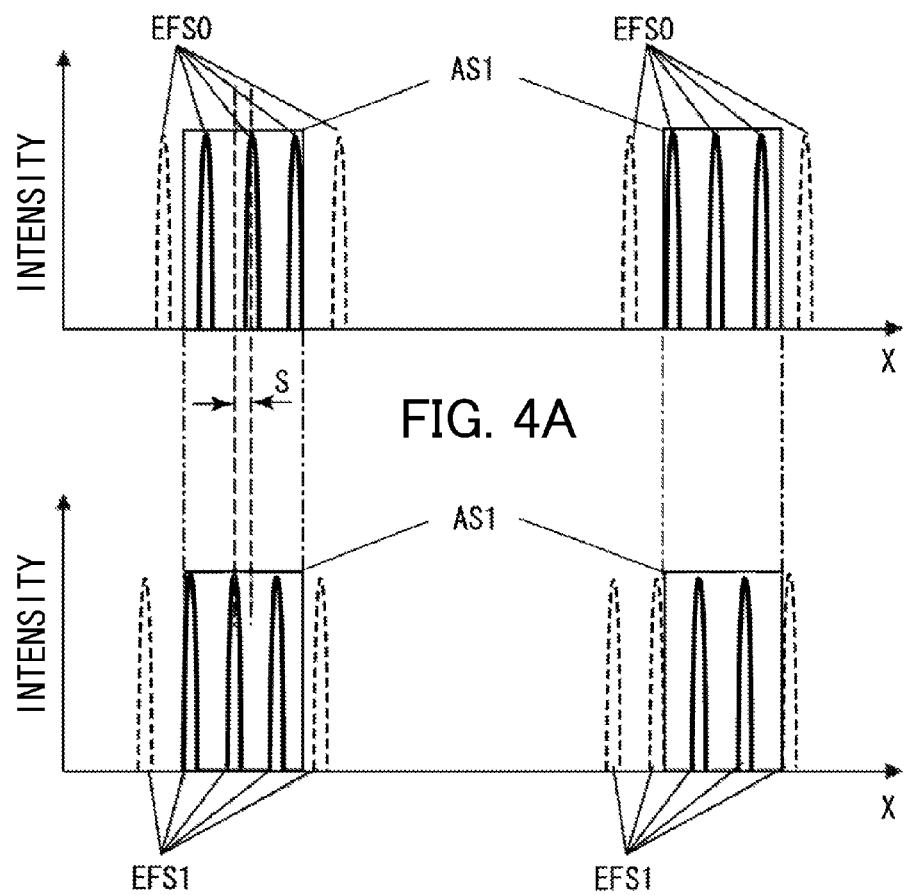
FIG. 4A
FIG. 4B
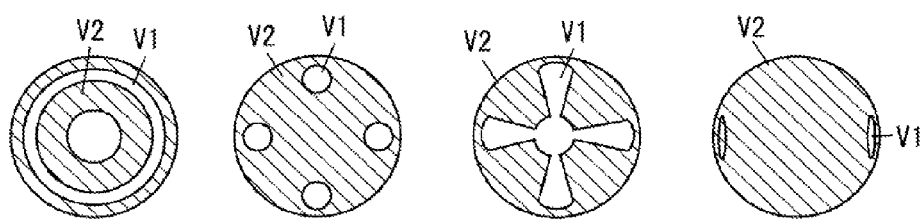
FIG. 5A  FIG. 5B  FIG. 5C  FIG. 5D

EXPOSURE APPARATUS, DEVICE MANUFACTURING METHOD, AND APERTURE STOP MANUFACTURING METHOD

BACKGROUND OF THE INVENTION

1. Field of the Invention

The present invention relates to an exposure apparatus, a device manufacturing method, and an aperture stop manufacturing method.

2. Description of the Related Art

There is conventionally known a projection exposure apparatus that illuminates a mask via an illumination optical system including an optical integrator configured to make uniform illumination light, and exposes a pattern of the mask onto a substrate via a projection optical system. An improvement of a resolution has recently been increasingly required for the projection exposure apparatus.

An off-axis illumination, such as a dipole illumination or a quadrupole illumination, is effective to the improvement of the resolution, and an off-axis illumination having a predetermined effective light source shape can be realized by an aperture stop arranged on an exit surface of the optical integrator (or a pupil in the illumination optical system). In particular, recently, an oblique incidence illumination is often required which uses an aperture stop that is very short in its radial direction. See Japanese Patent Laid-Open Nos. 2007-080947 and 5-315226.

The aperture stop is arranged at a (defocus) position that shifts from a back focal plane of the optical integrator so as to avoid the mechanical interference. This configuration causes a difference of an effective light source distribution for each image height on a surface to be illuminated, and an asymmetrical effective light source distribution at the off-axis position on the surface to be illuminated. As a result, critical dimension ("CD") variations of a pattern formed on the substrate increase, and the yield deteriorates. In particular, this influence cannot become ignored in the extremely oblique incidence illumination (having a large incident angle) which is recently required.

SUMMARY OF THE INVENTION

The present invention provides an exposure apparatus and an aperture stop manufacturing method configured to decrease CD variations of a mask pattern formed on a substrate.

An exposure apparatus according to one aspect of the present invention includes an illumination optical system configured to illuminate a mask, a projection optical system configured to project an image of a pattern of the mask onto a substrate, a wavefront splitting device configured to form a secondary light source at a position conjugate with a pupil plane in the projection optical system, and an aperture stop arranged at a position that shifts from a focal plane on an exit side of the wavefront splitting device, wherein the aperture stop includes a light shielding part, an opening part, and a light attenuation part that is located between the light shielding part and the opening part, and has a transmittance larger than that of the light shielding part and smaller than that of the opening part, and wherein a width of the light attenuation part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and $Z$ is a distance between the focal plane of the wavefront splitting device on the exit side and the aperture stop.

An exposure apparatus according to another aspect includes an illumination optical system configured to illuminate a mask, a projection optical system configured to project an image of a pattern of the mask onto a substrate, a wavefront splitting device configured to form a secondary light source at a position conjugate with a pupil plane that determines a numerical aperture in the projection optical system, and an aperture stop arranged at a position that shifts from a focal plane on an exit side of the wavefront splitting device, wherein the aperture stop includes a light shielding part, an opening part, and a patterned part that is located at a boundary between the light shielding part and the opening part, and has a transmittance larger than that of the light shielding part and smaller than that of the opening part.

A method for manufacturing an aperture stop according to another aspect of the present invention used for an exposure apparatus that includes an illumination optical system configured to illuminate the mask, a projection optical system configured to project an image of the pattern of the mask onto the substrate, and a wavefront splitting device configured to form a secondary light source at a position conjugate with a pupil plane in the projection optical system, and arranged at a position that shifts from a focal plane on an exit side of the wavefront splitting device includes the steps of providing the aperture stop with a light shielding part, an opening part, and a light attenuation part that is located between the light shielding part and the opening part, and has a transmittance larger than that of the light shielding part and smaller than that of the opening part, determining a width of the light attenuation part using a wavefront splitting period of the wavefront splitting device, or a numerical aperture of the wavefront splitting device on the exit side and a distance between the aperture stop and the focal plane on the exit side of the wavefront splitting device, and preparing the aperture stop that includes the light attenuation part having a determined width, the light shielding part, and the opening part.

Further features of the present invention will become apparent from the following description of exemplary embodiments (with reference to the attached drawings).

BRIEF DESCRIPTION OF THE DRAWINGS

FIGS. 4A and 4B are schematic views of rays incident upon the on-axis and off-axis positions on the surface to be illuminated in case of FIGS. 3A and 3B.

FIGS. 5A-5D are plane views of a variety of shapes applicable to an opening part in the aperture stop shown in FIG. 1.

DESCRIPTION OF THE EMBODIMENTS

Referring now to the accompanying drawings, a description will be given of embodiments of the present invention.

Figure 1:
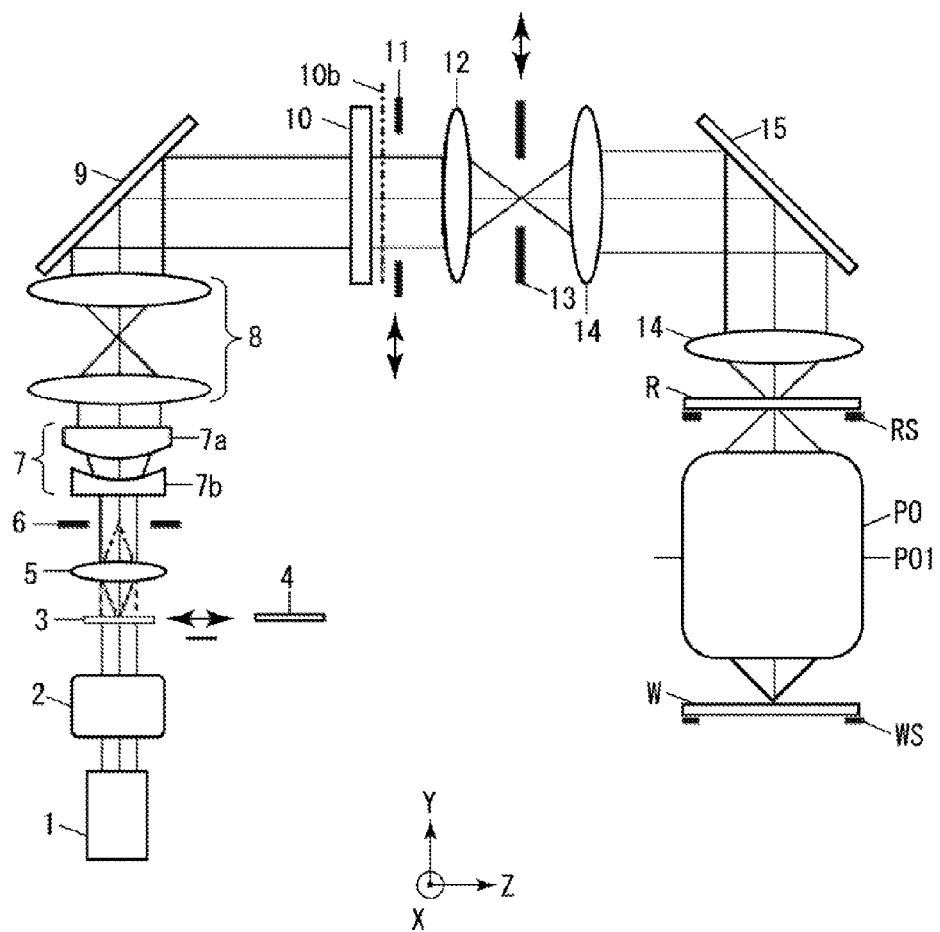
FIG. 1 is a block diagram of an exposure apparatus according to a first embodiment.

FIG. 1 is a block diagram of an exposure apparatus according to a first embodiment. A Z-axis direction is an optical-axis direction, and an XY plane is a plane perpendicular to the optical axis. The exposure apparatus includes a light source 1, an illumination optical system, a mask stage RS, a projection optical system PO, and a substrate stage WS, and exposes a pattern of a mask (or reticle) R onto a substrate (Si wafer or glass plate) W. In addition, the exposure apparatus is a scanning exposure apparatus that uses a step-and-scan method that scans the mask R and the substrate W relatively to each other. A Y-axis direction is a scanning direction, and an X-axis direction is a direction perpendicular to the scanning direction.

The light source 1 uses a mercury lamp or an excimer laser, but the present invention does not limit a type or a wavelength of the light source, or the number of light sources.

The illumination optical system includes, as shown in FIG. 1, a relay optical system 2 to an imaging optical system 14, and illuminates the mask R.

The relay optical system 2 converts a light bundle from the light source 1 into an approximately parallel light bundle that has a rectangular cross section. Reference numeral 3 denotes a diffraction optical element ("DOE"), which can be changed with a DOE 4 having a different characteristic. The exit light from the DOE 3 is condensed by a condenser lens 5, and forms a diffraction patterned part on a diffraction pattern plane 6. When the DOE is changed, a plurality of diffraction patterns, such as an annular shape or a multi-pole shape, can be formed.

The diffraction pattern formed on the diffraction pattern plane 6 is incident upon a deflection mirror 9 after its size and shape are adjusted by a prism 7 and a zoom lens 8. The prism 7 can provide zooming, and when a distance between a first prism member 7a and a second prism member 7b is sufficiently small, the first prism member 7a and the second prism member 7b can be regarded as one integral parallel-plane glass plate. At this time, the diffraction pattern formed on the diffraction pattern plane 6 is magnified or reduced by the zoom lens 8 while maintaining a similar shape, and forms an image on an incident surface of the optical integrator 10. The diffraction pattern formed on the diffraction pattern plane 6 can be adjusted in shape, such as an annular width, by separating the first prism member 7a and the second prism member 7b. A light bundle reflected on the deflection mirror 9 is incident upon the optical integrator 10.

The optical integrator 10 is an optical element configured to uniformly illuminate the mask R, and can use a fly-eye lens, a micro-lens array, etc. The optical integrator 10 of this embodiment is a fly-eye lens that serves as a wavefront splitting device configured to form secondary light sources at a position conjugate with a pupil plane PO1 in the projection optical system PO that determines a numerical aperture ("NA") of the projection optical system PO. Therefore, the optical integrator 10 is configured to two-dimensionally arrange a plurality of small lenses, to two-dimensionally split a light bundle incident upon the optical integrator 10, and to form secondary light sources on a pupil plane of the illumination optical system.

An aperture stop 11 configured to shield unnecessary light and to form a predetermined light intensity distribution is arranged on the pupil plane in the illumination optical system (at a position conjugate to the pupil plane PO1 in the projection optical system PO) or a position that slightly shifts from the back focal plane 10b of the optical integrator 10. The aperture stop 11 is arranged on a stop change unit (not shown), such as a turret, so that it can be changed with another aperture stop having a different shape as shown by arrows in FIG. 1.

An exit surface of the optical integrator 10 (or the pupil plane of the illumination optical system) has a Fourier transformation relationship (object-pupil or pupil-image relationship) with the mask R. Its light intensity distribution determines an angular distribution of an exposure light bundle incident upon the substrate W, and is referred to an effective light source distribution.

Figure 2A:
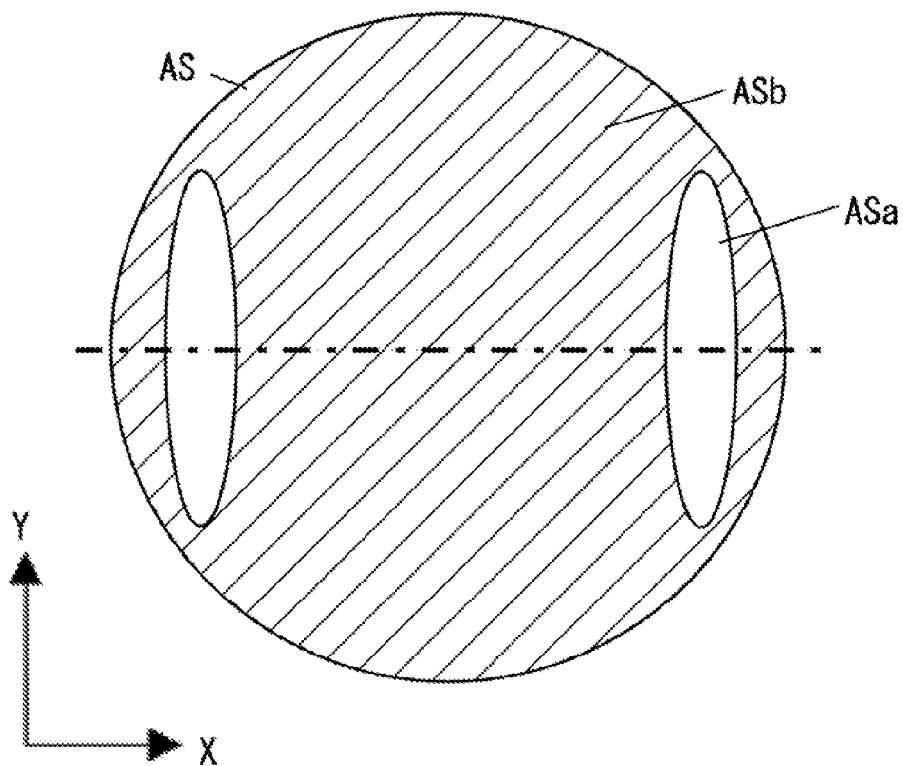
FIG. 2A is a plane view of a conventional aperture stop.
Figure 2B:
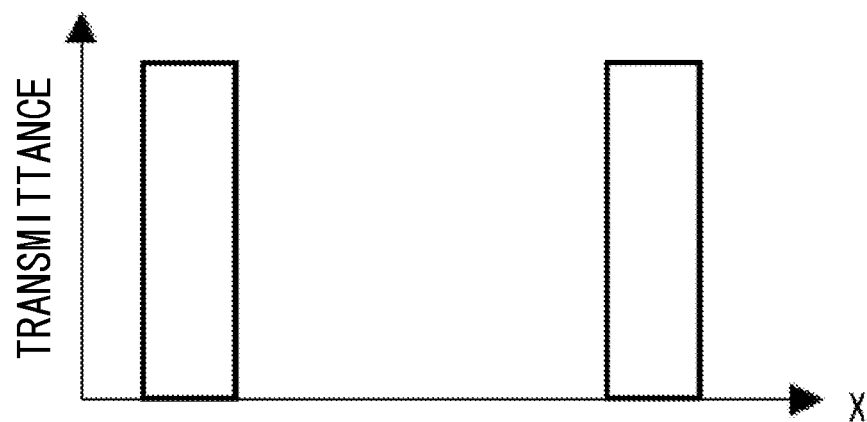
FIG. 2B shows a transmittance distribution in the X direction.

A description will now be given of a problem when the conventional aperture stop AS is used instead of the aperture stop 11. FIG. 2A is a plane view of the conventional aperture stop AS having an opening part ASa having a transmittance of 100%, and a light shielding part ASb having a transmittance of 0%. FIG. 2B is a transmittance distribution of the aperture stop AS in the X direction (at part shown by one alternate long and short dash line in FIG. 2A). As described above, the aperture stop AS is mounted on the stop change unit that can selects one of a plurality of aperture stops in accordance with an illumination condition, and a back focal plane 10b of the optical integrator 10 is extremely close to an end surface of the optical integrator 10. In order to avoid the mechanical interference among a stop holding mechanism, the stop change unit, and the optical integrator 10, the aperture stop AS has to be arranged at a (defocus) position that shifts from the back focal plane 10b of the optical integrator 10.

Figure 3A:
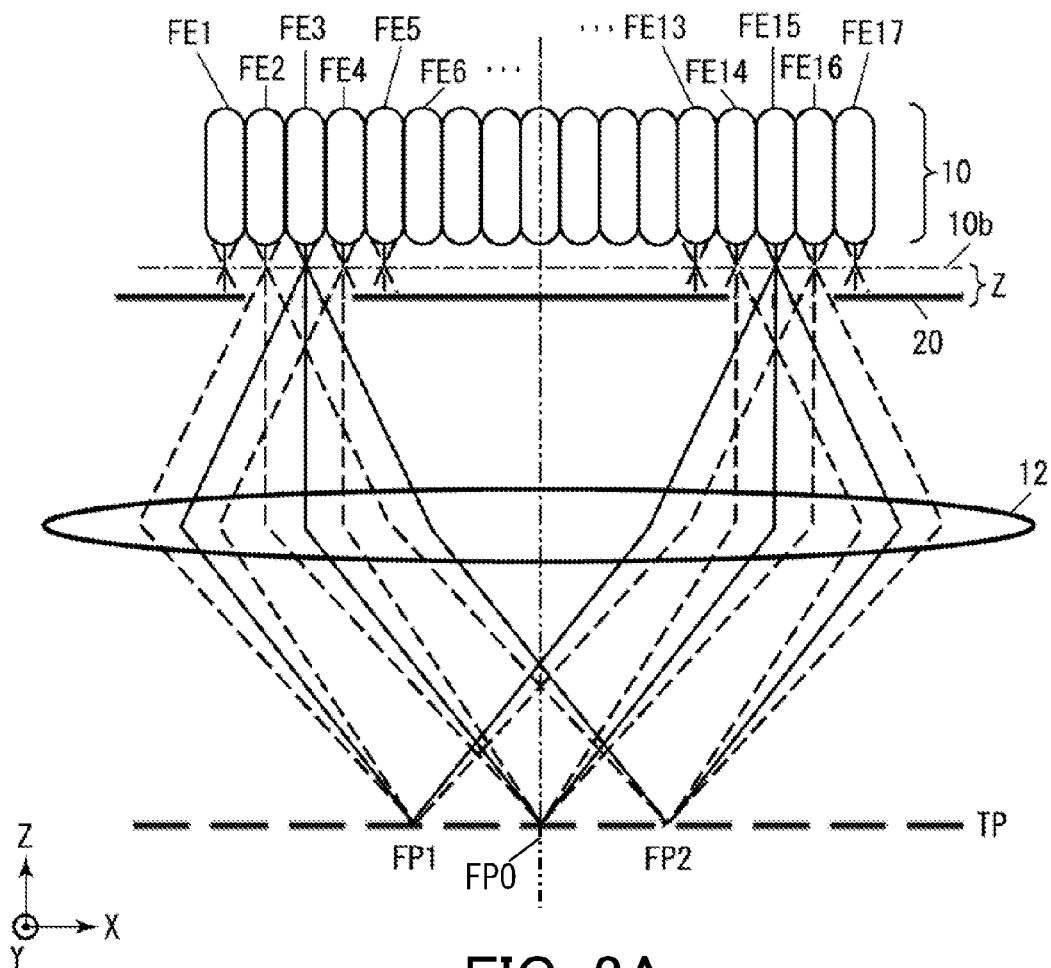
FIGS. 3A and 3B schematically show effective light source distributions at on-axis and off-axis positions on a surface to be illuminated when the aperture stop shown in FIG. 2A is arranged at a position that shifts from a back focal plane of an optical integrator.

FIG. 3A schematically shows rays incident upon on-axis and off-axis positions on a surface to be illuminated (mask R or a surface conjugate with the mask R) TP, when the stop is arranged at a defocus position that shifts from the back focal plane 10b of the optical integrator 10. The optical integrator 10 is a fly-eye lens, which includes small lenses FE1 to FE17. The light bundle incident upon the fly-eye lens is two-dimensionally splitted, and forms secondary light sources on the pupil plane in the illumination optical system. A period of the secondary light source depends on the period of small lenses. Reference numeral 12 is a condenser lens configured to superimpose the secondary light sources, which are formed by the optical integrator 10, on the surface to be illuminated TP and to illuminate the surface to be illuminated TP. Therefore, the light incident upon the surface to be illuminated TP has a discrete angular distribution dependent upon a period of the secondary light source formed by the fly-eye lens.

The light bundle exited from the fly-eye lens at the same angle forms an image at the same position on the surface to be illuminated TP. For simplifying the figure, FIG. 3A shows only rays that are exited from FE1-FE5 and FE13-FE17 and reach three points, i.e., an on-axis position FP0 and two off-axis positions FP1 and FP2 on the surface to be illuminated TP.

When the aperture stop AS is located on the back focal plane 10b of the fly-eye lens, the rays exited from the same small lens pass the same position on the pupil plane (aperture stop). When the condenser lens 12 is an ideal lens, the rays incident upon the on-axis position FP0 and the off-axis position FP1 and FP2 have the same angular distribution.

On the other hand, when the aperture AS defocuses from the back focal plane 10b of the fly-eye lens as shown in FIG. 3A, the rays exited from the same fly-eye lens pass different positions on the aperture stop in accordance with the exit angle from the fly-eye lens and the defocus amount. Thus, the angular distribution of the light bundle incident upon the on-axis position FP0 becomes different from the angular distributions of the light bundles incident upon the off-axis positions FP1 and FP2. Moreover, in FIG. 3A, the rays exited from the small lenses FE2, FE3, FE4, FE14, FE15, and FE16 are incident upon the on-axis position FP0. On the other hand, the aperture stop shields the ray exited from the small lens FE14 which would enter the off-axis position FP1, and the ray exited from the small lens FE4 which would be incident upon the off-axis position FP2. In other words, the rays incident upon the on-axis position FP0 and the off-axis positions FP1 and FP2 have different angular (or effective light source) distributions from each other.

FIG. 4A schematically shows an effective light source distribution EFS0 at the on-axis position FP0 and a transmittance distribution AS1 of the aperture stop AS. FIG. 4B schematically shows an effective light source distribution EFS1 at the off-axis position FP1 and a transmittance distribution AS1 of the aperture stop AS. A broken line indicates a light intensity distribution shielded by the aperture stop AS. The effective light source distribution EFS1 shifts by an amount "s" that depends upon an image height from the effective light source distribution EFS0. As a result, the rays from three small lenses FE2, FE3, and FE4 are incident upon the left side of the effective light source distribution of FP1, whereas the rays from only two small lenses FE15 and FE16 are incident upon the right side of the effective light source distribution, and thus a light quantity difference increases between the left and right sides of the effective light source distribution.

This light quantity difference between the left and right sides of the effective light source distribution causes a CD difference between the left and right sides of the pattern and a positional shift (defocus distortion) of the exposure pattern when the substrate W defocuses from the focal position of the projection optical system PO.

As described above, when the aperture stop AS is arranged at the defocus position from the back focal plane 10b of the fly-eye lens, the incident angle distribution of the off-axis position has an angular distribution that shifts from that of the on-axis position. In other words, a difference of an incident angle distribution (effective light source distribution) occurs for each image height on the surface to be illuminated TP, and additionally the asymmetry occurs in the effective light source distribution at the off-axis position. As a consequence, CD variations increase on an exposure field of the pattern formed on the substrate, and the yield deteriorates in the semiconductor device manufacturing.

Accordingly, this embodiment uses the aperture stop 11. Similar to the aperture stop AS, the aperture stop 11 is arranged at the (defocus) position that shifts to the exit side from the back focal plane 10b of the optical integrator 10 (or from the focal plane on the exit side of the optical integrator 10).

The aperture stop 11 has a light shielding part, an opening part having a shape configured to provide an off-axis illumination to the mask R, and a light attenuation part, which will be described later. The opening part provides an off-axis illumination, and thus can improve the resolution. Here, the off-axis illumination provided by the opening part in the aperture stop 11 according to this embodiment is a dipole illumination. However, the light shielding part and the opening part of the aperture stop 11 may use a variety of optimized shapes to the pattern of the mask R, as shown in FIGS. 5A to 5D. In FIGS. 5A to 5D, V1 denotes the opening part, and V2 denotes the light shielding part. FIGS. 5A to 5D omit the light attenuation part of this embodiment. The aperture stop shown in FIG. 5A provides an illumination that combines a small σ illumination and an annular illumination, the aperture stop shown in FIG. 5B provides a quadrupole illumination, the aperture stop shown in FIG. 5C provides a cross (or windmill) illumination, and the aperture stop shown in FIG. 5D provides a dipole illumination. A width of the light attenuation part is determined, as described later, based on the calculated influence degree, after the influence degree which the light shielding part provides on the imaging performance of the pattern is calculated using shape information (such as a dipole) of the light shielding part and the opening part.

Figure 6A:
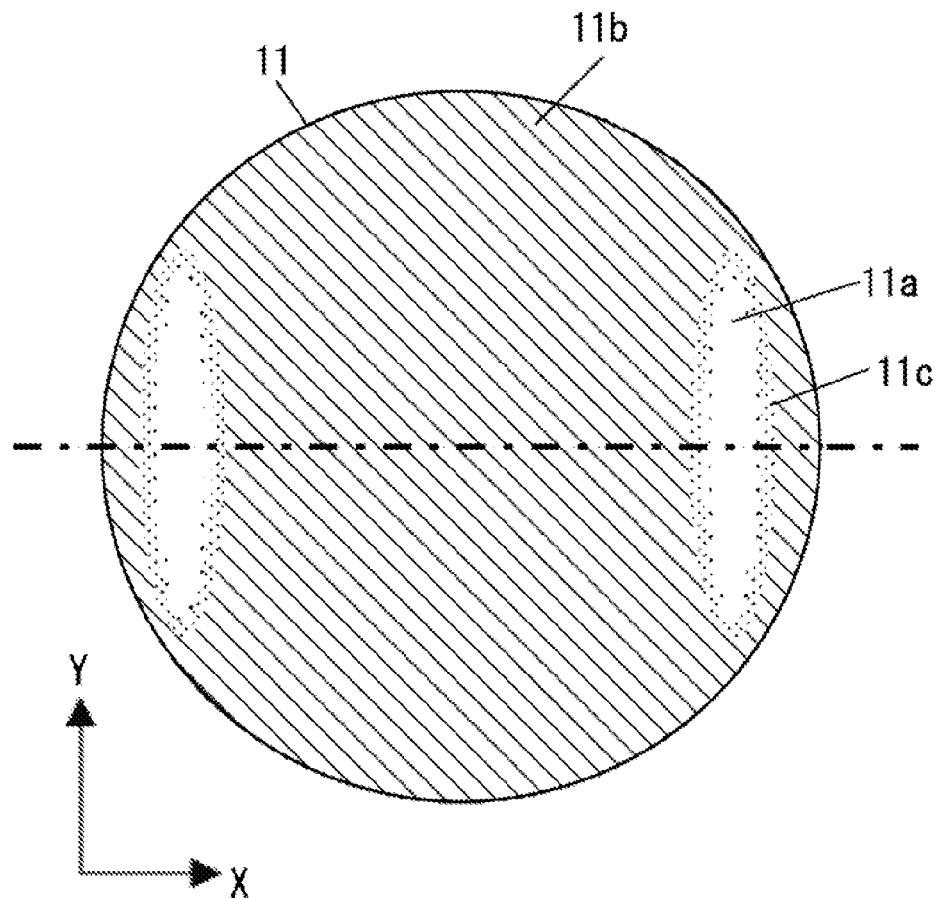
FIG. 6A is a plane view of the aperture stop shown in FIG. 1.
Figure 6B:
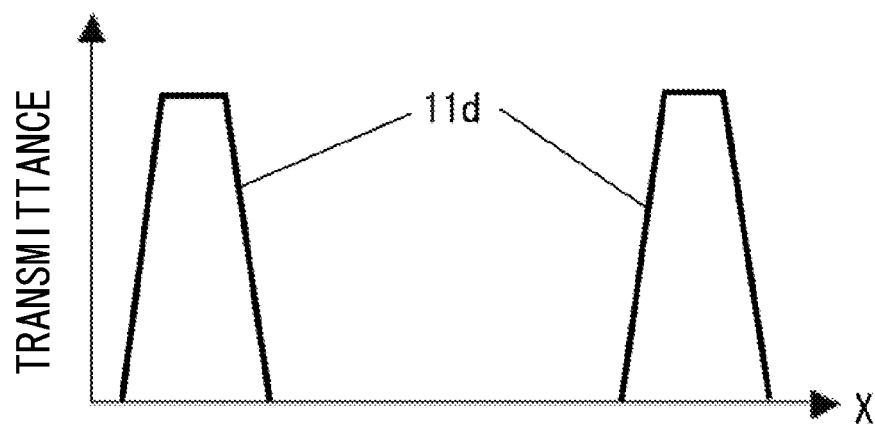
FIG. 6B shows a transmittance distribution in the X direction.

FIG. 6A is a plane view of the aperture stop 11. The aperture stop 11 includes a light attenuation part 11c that is located between an opening part 11a having a transmittance of 100% and a light shielding part 11b having a transmittance of 0%, and has an intermediate transmittance between the transmittance of the opening part 11a and the transmittance of the light shielding part 11b. In other words, the intermediate transmittance is greater than the transmittance of the light shielding part 11b and smaller than the transmittance of the opening part 11a. FIG. 6B shows a transmittance distribution on the section along the X axis (or of the part shown by one alternate long and short dash line) of the aperture stop 11. A transmittance distribution 11d of the light attenuation part 11c of the aperture stop 11 continuously changes from approximately 0% to 100% between the opening part 11a and the light shielding part 11b.

Figure 7A:
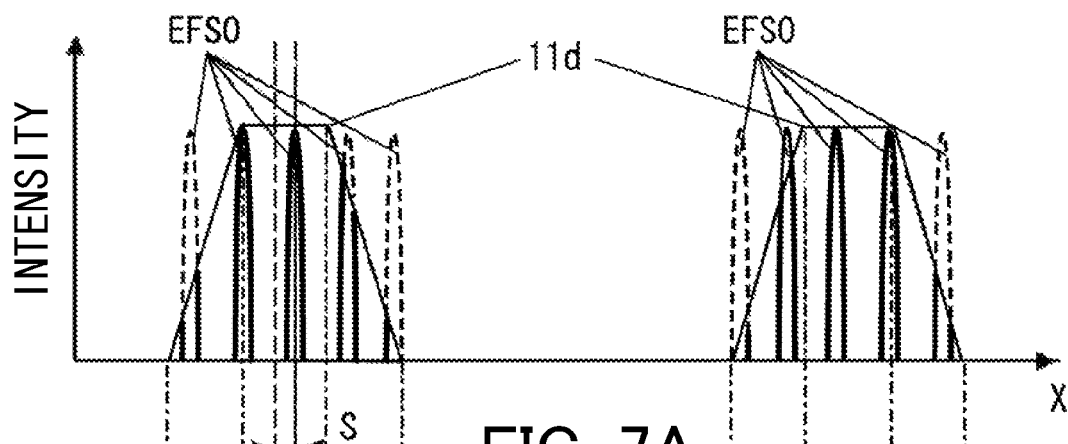
FIGS. 7A and 7B schematically show effective light source distributions at on-axis and off-axis positions on a surface to be illuminated when the aperture stop shown in FIG. 6A is arranged at a position that shifts from a back focal plane of the optical integrator shown in FIG. 1.
Figure 7B:
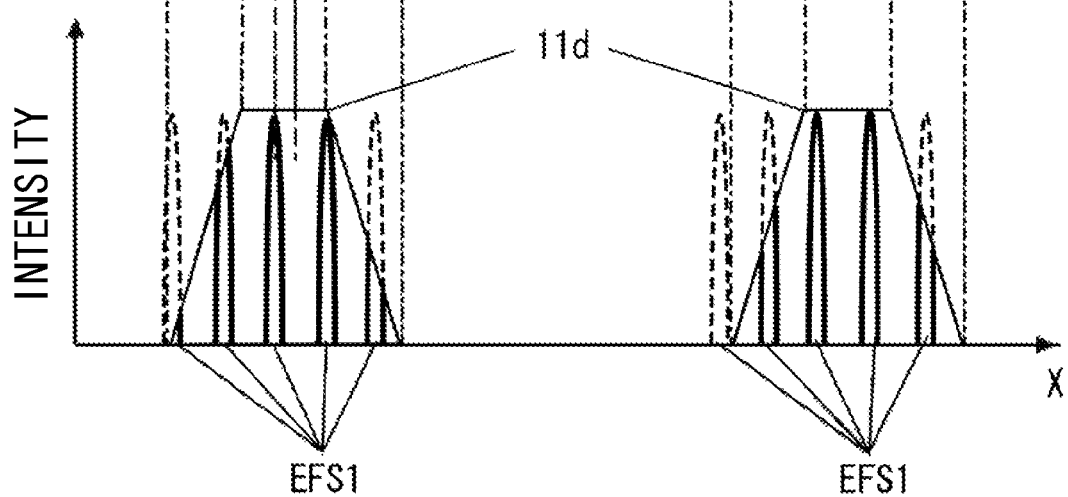

FIG. 7A schematically shows the effective light source distribution EFS0 at the on-axis position on the surface to be illuminated TP and the transmittance distribution 11d of the aperture stop 11. FIG. 7B schematically shows the effective light source distribution EFS1 at the off-axis position on the surface to be illuminated TP and the transmittance distribution 11d of the aperture stop 11. A broken line indicates a light intensity distribution shielded by the aperture stop 11. The effective light source distribution EFS1 shifts by the amount "s" from the effective light source distribution EFS0, but the light attenuation part 11c that is formed between the light shielding part 11b and the opening part 11a mitigates changes of the width and size of the effective light source distribution in comparison with FIG. 4B. Moreover, a light quantity difference between the left and right sides of the effective light source distribution EFS1 becomes smaller than that shown in FIG. 4B. Therefore, even when the effective light source distribution EFS1 shifts from the effective light source distribution EFS0, the influence to the CD variations becomes smaller than that using the aperture stop AS.

Figure 8A:
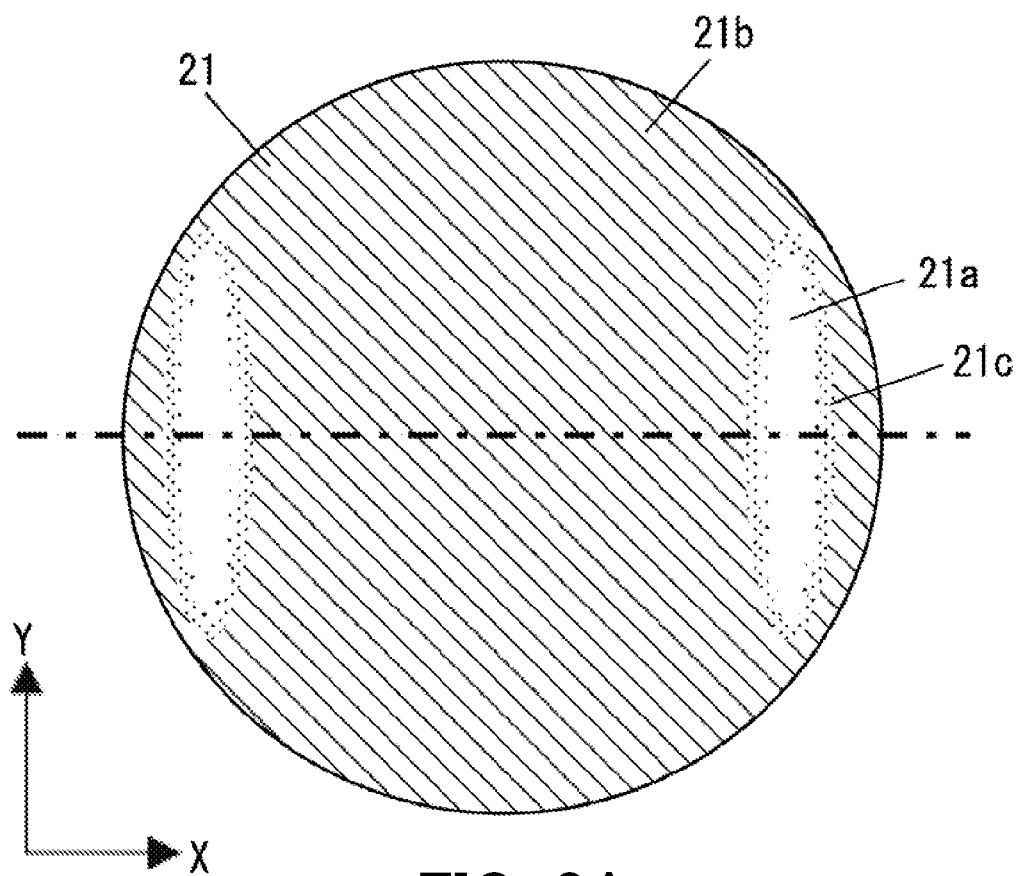
FIG. 8A is a plane view of an aperture stop that can be replaced with the aperture stop shown in FIG. 6A.
Figure 8B:
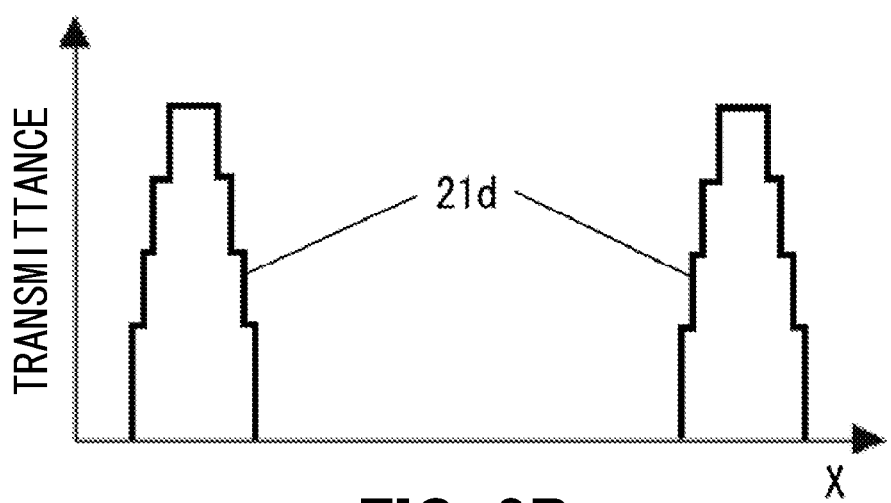
FIG. 8B shows a transmittance distribution in the X direction.
Figure 9A:
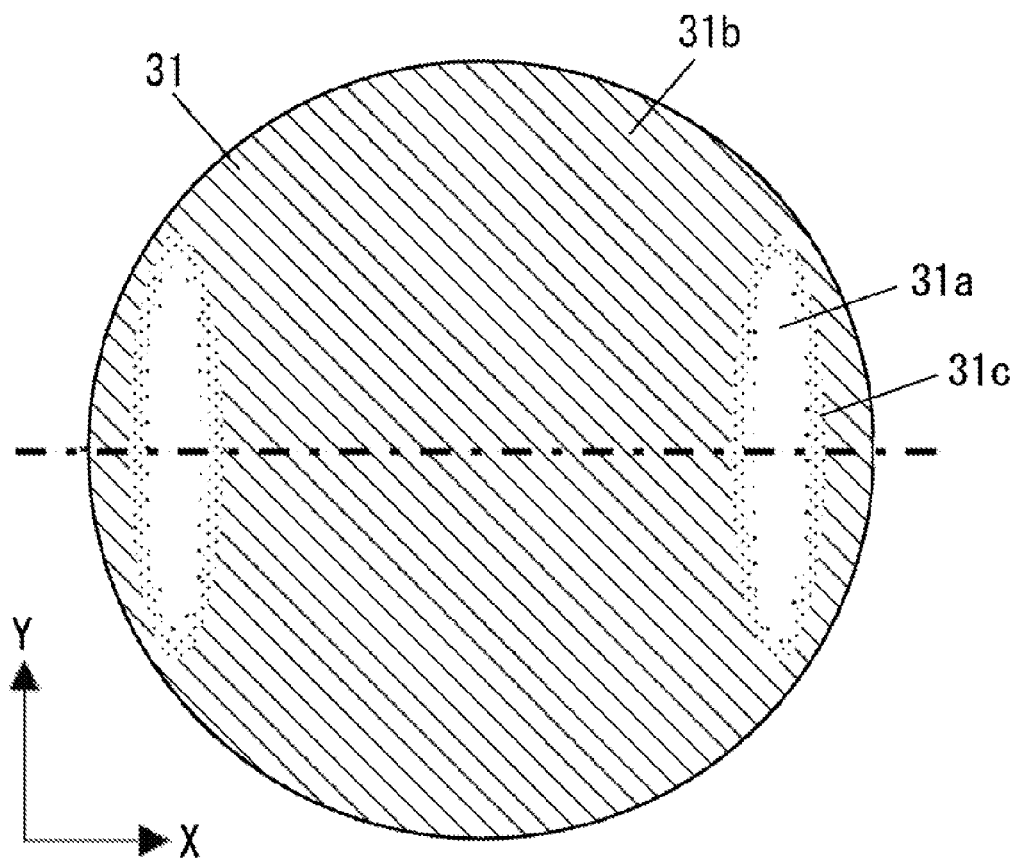
FIG. 9A is a plane view of another aperture stop that can be replaced with the aperture stop shown in FIG. 6A.
Figure 9B:
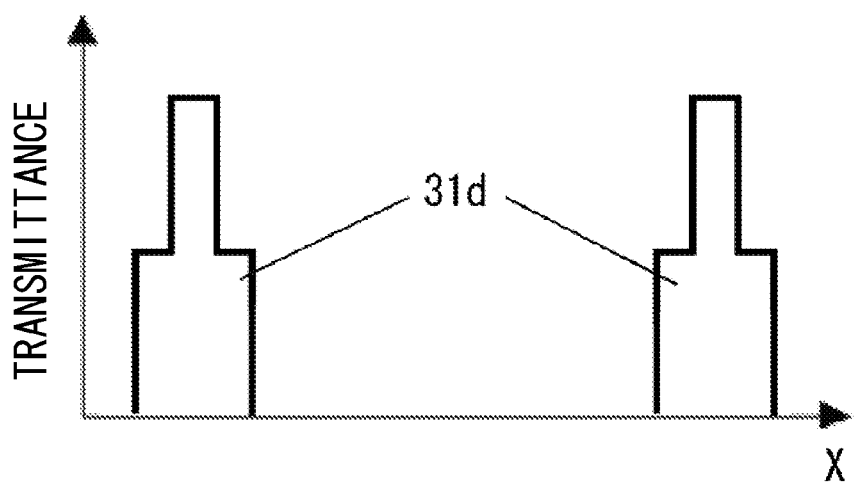
FIG. 9B shows a transmittance distribution in the X direction.

The aperture stop 11 has the light shielding part 11b that is formed by vapor-depositing Cr onto a light transmitting member, such as quartz or calcium fluoride. The light attenuation part 11c includes, for example, a light attenuating filter in which Cr is vapor-deposited at a predetermined concentration, a thin film designed to have a predetermined transmittance, etc. The light attenuation part 11c is not limited to the continuously changing transmittance distribution shown in FIG. 6B. For example, the aperture stop 11 may be replaced with an aperture stop 21 shown in FIG. 8A, or an aperture stop 31 shown in FIG. 9A. The aperture stop 21 shown in FIG. 8A includes a light attenuation part 21c that is located between the opening part 21a having a transmittance of approximately 100%, and a light shielding part 21b having a transmittance of approximately 0%, and has an intermediate transmittance between the transmittance of the opening part 21a and the transmittance of the light shielding part 21b. In addition, the aperture stop 21 has a transmittance distribution 21d that discretely changes as shown in FIG. 8B. The aperture stop 31 shown in FIG. 9A includes a light attenuation part 31c that is located between the opening part 31a having a transmittance of approximately 100%, and a light shielding part 31b having a transmittance of approximately 0%, and has an intermediate transmittance between the transmittance of the opening part 31a and the transmittance of the light shielding part 31b. In addition, the aperture stop 31 has a constant transmittance distribution 31d of about 50%, as shown in FIG. 9B.

Figure 3B:
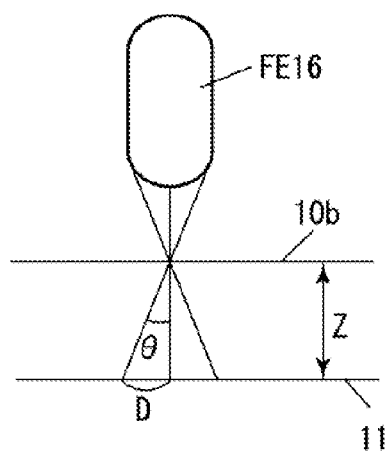

A shift amount D of an effective light source distribution at the most off-axis position from that at the on-axis position in the illumination field in the surface to be illuminated TP at a position of the aperture stop from the off-axis position is expressed by the following equations. Here, α is a NA on the exit side of the optical integrator 10 (NA on the exit side of the small lens). Z is a distance in the Z-axis (optical axis) direction between the back focal plane 10b of the optical integrator 10 and the aperture stop 11. FIG. 3B is an enlarged sectional view near the small lens FE16 when the aperture stop 20 shown in FIG. 3A is replaced with the aperture stop 11. The following equations are established where θ is an angle between a marginal ray exited from the small lens FE16 and the Z-axis direction.

$$D = Z \times \tan\theta \quad \text{EQUATION 1}$$

If it is assumed that the air has a refractive index of 1, the following equation is met:

$$\alpha = n \times \sin\theta = \sin\theta \quad \text{EQUATION 2}$$

Therefore, Equation 3 below is established $$D = Z \times \tan(\arcsin(\alpha)) \quad \text{EQUATION 3}$$

In order to reduce the CD variations that would occur due to a shift of the effective light source distribution at the off-axis position from the effective light source distribution at the on-axis position on the surface to be illuminated TP, the width of the light attenuation part 11c of the aperture stop 11 in the X-axis direction may be set equal to or greater than D/2.

The effective light source distribution has discreteness at a period corresponding to the period of the secondary light source formed by the optical integrator 10. Therefore, a width of the light attenuation part 11c in the surface perpendicular to the optical axis may be equal to or greater than the period of the secondary light source formed by the optical integrator 10.

As the opening part 11a of the opening part 11 becomes smaller, the influence of the shift of the effective light source distribution and thus the influence on the CD variations increase. According to the studies of the present invention, when the longest length in a radial direction on the surface perpendicular to the optical axis of the opening part 11a is equal to or smaller than a length that is fifteen times as long as the period of the secondary light source formed by the optical integrator 10, the influence on the CD variation of the shift of the effective light source becomes non-negligible. The longest length in the radial direction is the length in the X-axis direction in this embodiment. Thus, when the length of the opening part 11a in the aperture stop 11 in the radial direction is equal to or smaller than a length that is fifteen times as long as the period of the secondary light source formed by the optical integrator 10, the light attenuation part 11c may be provided between the opening part 11a and the light shielding part 11b.

The opening part 11a of the aperture stop 11 is optimized to the pattern of the mask. The optimization usually weights only the opening part 11a and the light shielding part 11b for calculational simplicity, and it is thus effective that the light attenuation part 11c has a minimum width that maintains the imaging performance as optimal as possible.

Figure 13A:
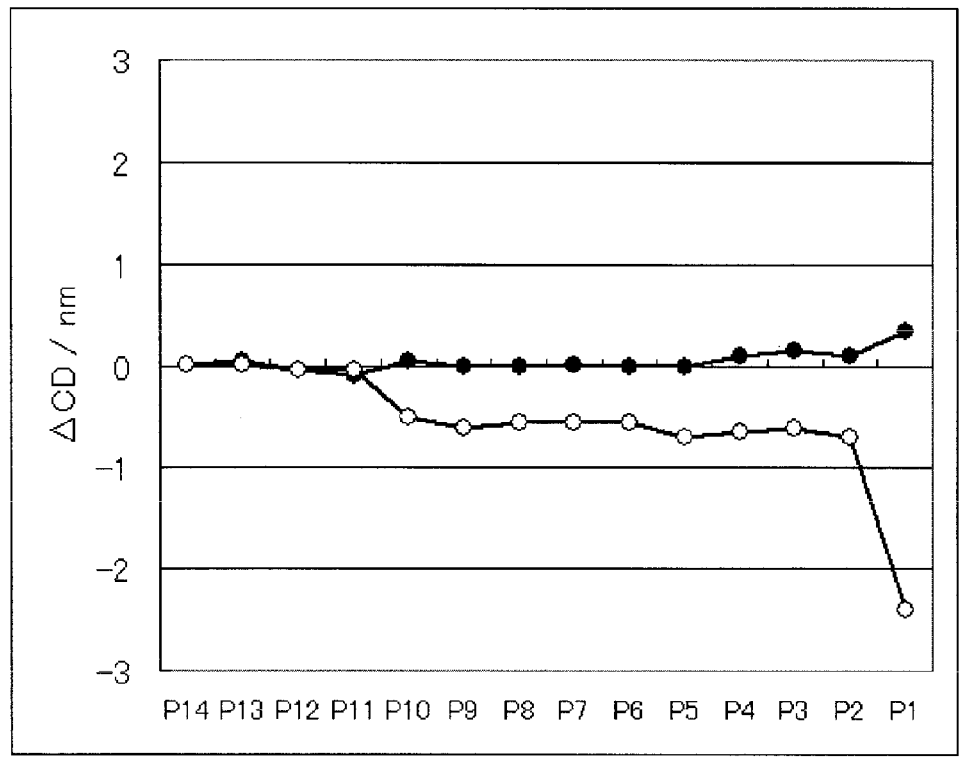
FIGS. 13A and 13B are views for explaining a determination of an upper limit of a width of a light attenuation part based on the influence degree of the light attenuation part on the imaging performance of a mask pattern.
Figure 13B:
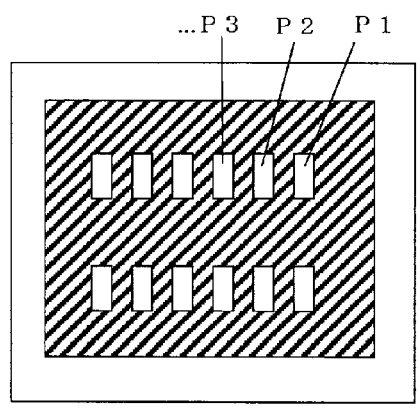

An upper limit of the width of the light attenuation part can be determined based on the influence degree provided by the light attenuation part on the imaging performance of the mask pattern. FIG. 13A is a simulation result of CD differences of the pattern formed on the substrate W when the aperture stop 11 shown in FIGS. 6A and 6B is used. The ordinate axis denotes an error with a target CD, and an abscissa axis denotes patterns arranged in the periodical direction. A black dot indicates a result when the light attenuation part 11c is twice as wide as the (wavefront splitting) period of the secondary light source formed by the optical integrator 10. A white dot indicates a result when the light attenuation part 11c is six times as wide as the (wavefront splitting) period of the secondary light source formed by the optical integrator 10. The pattern is a contact hole pattern, as shown in FIG. 13B, which is periodic in one direction and isolated in a direction orthogonal to that direction. Although FIG. 13B shows only twelve patterns, more patterns are actually formed in the periodic direction and the direction orthogonal to that direction of the pattern (for example, there are P15 or more in the periodic direction). P1 in FIG. 13A is an end pattern in the pattern's periodic direction (and no additional patterns are provided at the right side). A P14 side is a dense part of the pattern in the periodic direction (and there are additional patterns in the periphery).

The imaging performance where the light attenuation part 11c is twice as wide as the period of the secondary light source formed by the optical integrator 10 is not worse than that with the aperture stop that includes only the opening part and the light shielding part. On the other hand, when the light attenuation part 11c is six times as wide as the period of the secondary light source formed by the optical integrator 10, a difference from the target CD increases and the imaging performance deteriorates. When the light attenuation part 11c is five times as wide as the period of the secondary light source formed by the optical integrator 10, a good result similar to that for two periods is obtained although not shown so as to facilitate understanding of the result of five periods. From the above, in FIG. 13A, a width of the light attenuation part 11c may be set within a range from a length that is twice as wide as to a length that is five times as wide as the period of the secondary light source formed by the optical integrator 10. In general, the light attenuation part 11c needs to be equal to or smaller than five times as wide as the period of the secondary light source formed by the optical integrator 10.

As discussed above, in manufacturing the aperture stop based on the result of FIG. 13A, a width of the light attenuation part can be determined by using the wavefront splitting period of the wavefront splitting device or the NA on the exit side of the wavefront splitting device and a distance between the focal plane on the exit side of the wavefront splitting device and the aperture stop. In addition, Equation 3 can be considered so as to determine the width of the light attenuation part. Then, the light attenuation part is prepared with the thus determined width.

Japanese Patent Laid-Open No. 5-315226 proposes to continuously change the light transmittance between the light shielding part and the opening part of the aperture stop so as to provide an off-axis illumination corresponding to the mask pattern having a variety of pitches in a step-and-repeat exposure apparatus. However, Japanese Patent Laid-Open No. 5-315226 that secures the light attenuation part as wide as possible is likely to deteriorate the imaging performance that is optimized to the mask pattern and, in this respect, the aperture stop 11 of this embodiment is different from Japanese Patent Laid-Open No. 5-315226.

In summary, it is necessary that a width of the light attenuation part is determined or designed within a range from a length that is the wavefront splitting period of the optical integrator 10 or a value of $Z \times \tan(\arcsin(\alpha))/2$ to a length that is five times as long as the wavefront splitting period of the optical integrator 10.

Since a scanning exposure apparatus configured to synchronously scan the mask stage RS and the substrate stage WS and to provide scanning exposures exposes the surface to be illuminated TP accumulatively in the scanning direction (Y-axis direction), the effective light source distribution at the on-axis position and that at the off-axis position are accumulated and averaged in the scanning direction. Since a difference of the effective light source distribution in the scanning direction between the on-axis position and the off-axis position is not problematic, the light attenuation part 11c of the aperture stop 11 may be formed in at least part of the opening part 11a in the (X-axis) direction orthogonal to the scanning direction.

Figure 10:
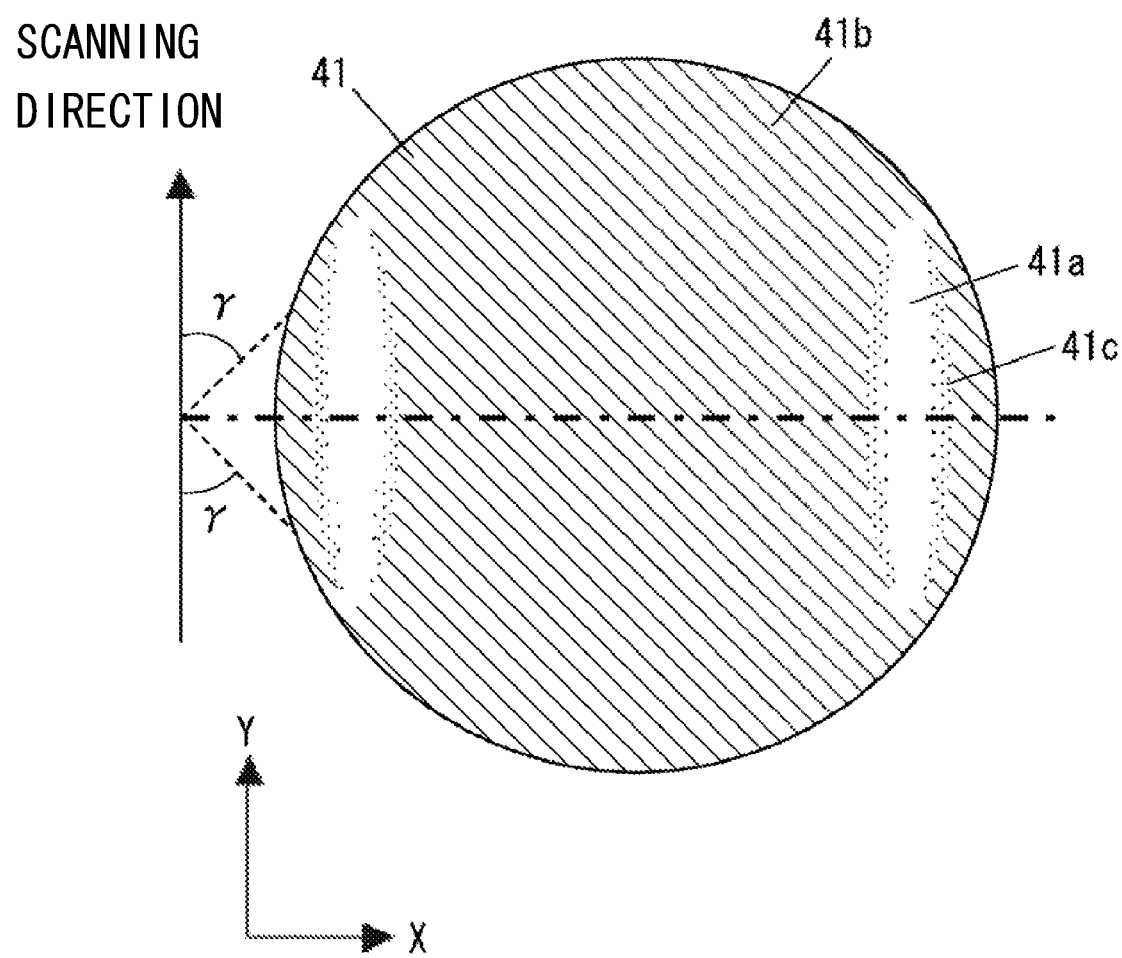
FIG. 10 is a plane view of still another aperture stop that can be replaced with the aperture stop shown in FIG. 6A.

For example, the aperture stop 11 may be replaced with an aperture stop 41 having a light attenuation part 41c shown in FIG. 10. The aperture stop 41 shown in FIG. 10 includes the light attenuation part 41c that is located between an opening part 41a having a transmittance of approximately 100%, and a light shielding part 41b having a transmittance of approximately 0%, and has an intermediate transmittance between the transmittance of the opening part 41a and the transmittance of the light shielding part 41b. In FIG. 10, the Y-axis direction is the scanning direction. In forming the light attenuation part 41c, an aperture stop having no attenuation part 41c is considered, and the light attenuation part 41c is provided so that an absolute value of an angle γ between a tangent between the opening part 41a and the light shielding part 41b and the Y-axis direction as the scanning direction can range from 0° to 45°. Part corresponding to an absolute value of an angle γ between the tangent between the opening part 41a and the light shielding part 41b and the scanning direction ranges from 45° to 90° is sufficiently averaged by the scanning exposure and thus it is unnecessary to provide the light attenuation part 41c.

The exit light bundle from the optical integrator 10 is condensed by the condenser lens 12, and the secondary light sources formed on the pupil plane in the illumination optical system are superimposed and illuminate a field stop 13 that is arranged at a position conjugate with the mask R (and substrate W) as the surface to be illuminated. The field stop 13 is a stop configured to define an exposure field of the mask R (and substrate W) held by the mask stage RS, and includes a plurality of movable light shielding plates configured to form an arbitrary aperture shape. Reference numerals 14 and 15 denote imaging optical systems configured to project the aperture shape formed by the field stop 13 onto the mask R.

The projection optical system PO projects the pattern of the mask R onto the substrate W supported by the substrate stage WS.

In exposure, the mask stage RS and the substrate stage WS are synchronously scanned for scanning exposures. A photoresist (photosensitive agent) is applied onto the substrate W, and the pattern is formed on the substrate W by projecting, resolving, and developing the pattern on the mask R.

Figure 11A:
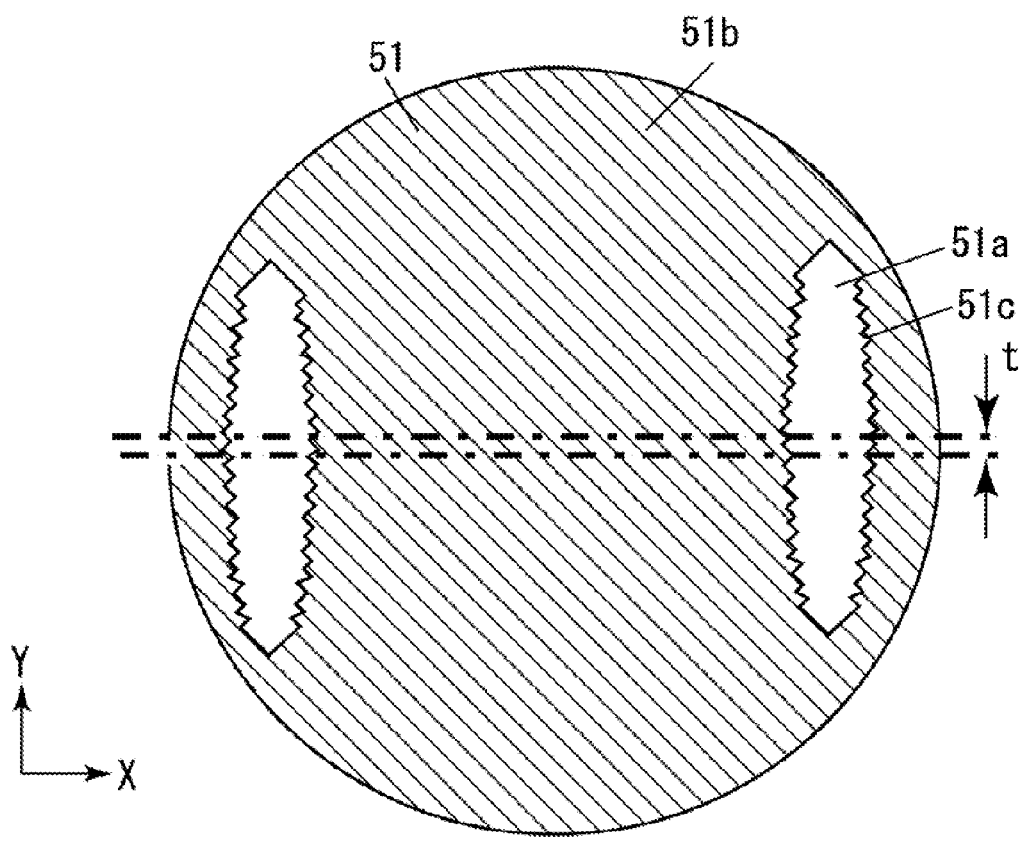
FIG. 11A is a plane view of an aperture stop according to a second embodiment.
Figure 11B:
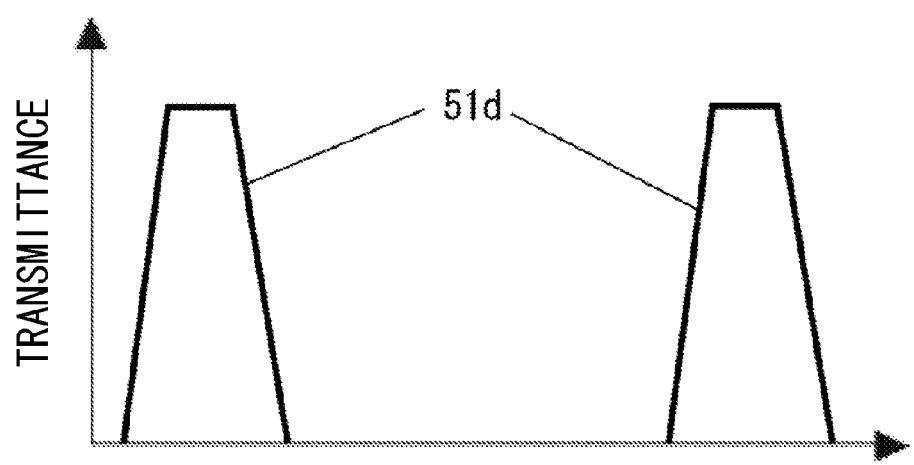
FIG. 11B shows a transmittance distribution in the X direction.

The second embodiment is similar to the first embodiment except that the second embodiment uses an aperture stop 51 instead of the aperture stop 11. FIG. 11A is a plane view of the aperture stop 51. The aperture stop 51 includes a fine serrated patterned part 51c having a period "t" and an amplitude "A" at a boundary between an opening part 51a and a light shielding part 51b. FIG. 11B is a view showing an accumulated transmittance distribution 51d in the Y-axis direction for each X position in an area having the width "t" of the aperture stop 51 along the scanning direction (Y-axis direction) (an area held by one alternate long and short dash lines shown in FIG. 11A). The patterned part 51c is located at a boundary between the opening part 51a and the light shielding part 51b, and has a transmittance between the transmittance of the opening part 51a and the transmittance of the light shielding part 51b.

The width of the opening part 51a of the aperture stop 51 in the X-axis direction continuously changes by ±A in the area held by one alternate long and short dash lines shown in FIG. 11A. Thus, the accumulated transmittance distribution in the Y-axis direction at each X position in the area having the width "t" has a distribution that continuously changes in the Y-axis direction between the opening part 51a and the light shielding part 51b, as shown in FIG. 11B. In other words, a light attenuation part is substantially formed between the opening part 51a and the light shielding part 51b by forming a fine patterned part at the boundary between the opening part 51a and the light shielding part 51b. The light attenuation part can reduce the CD variations that would otherwise occur when the effective light source distribution at the off-axis position shifts.

Figure 12:
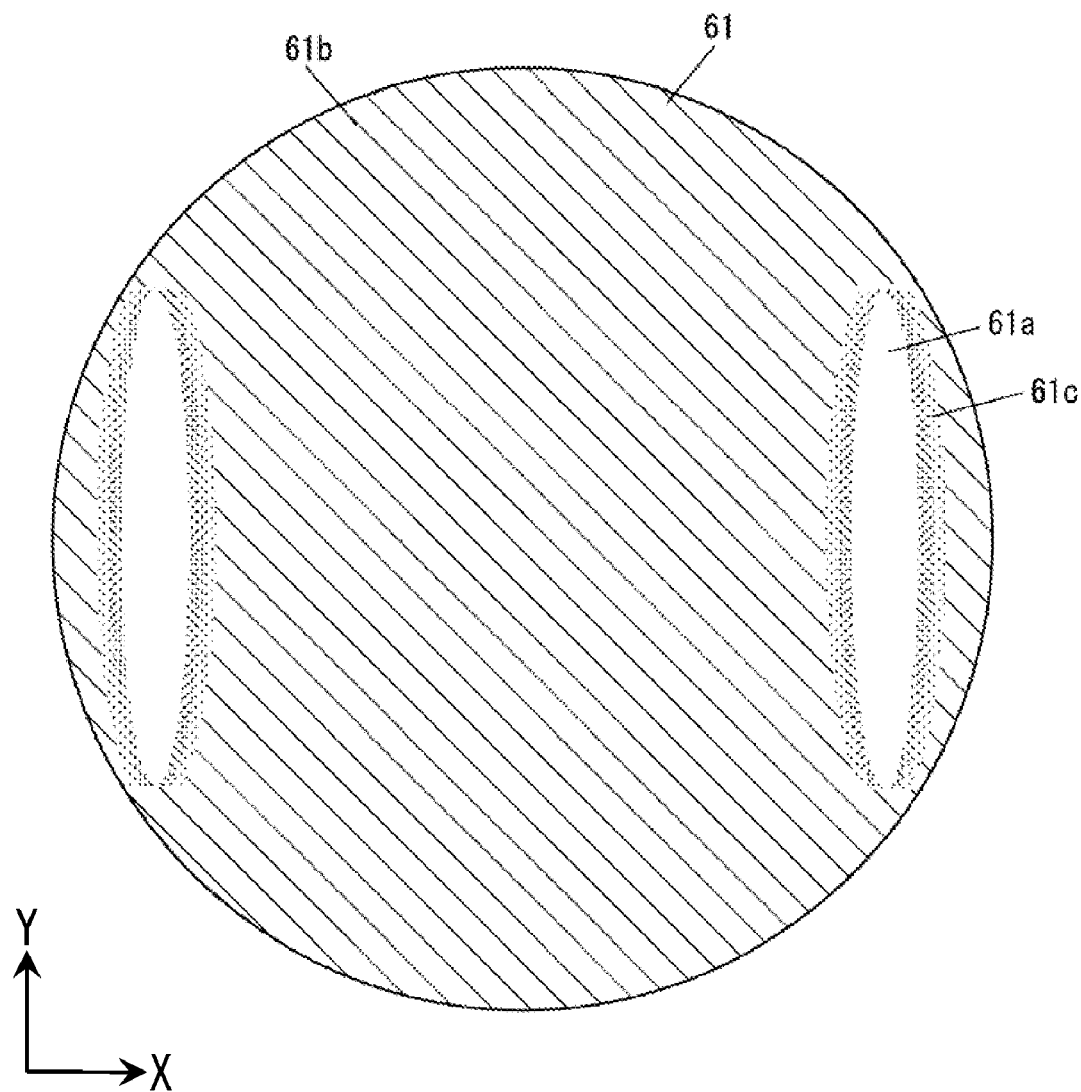
FIG. 12 is a plane view of a variation of the aperture stop shown in FIG. 11.

The patterned part 51c is not limited to the serrated pattern and may have a corrugated pattern. Moreover, the patterned part 51c may have a pattern of a set of micro holes having different densities and diameters or dotted pattern, as shown in FIG. 12. The patterned part 51c can substantially form the light attenuation part between the light shielding part and the opening part. FIG. 12 is a plane view of an aperture stop 61 having a patterned part 61c having a set of holes at the boundary between the opening part 61a and the light shielding part 61b.

The aperture stop 51 may be made, for example, by processing a metallic plate into a predetermined opening shape using a laser or etching, or a light shielding part having a predetermined shape and a fine shape may be formed by vapor-depositing Cr onto a light transmitting member, such as quartz or calcium fluoride.

In order to reduce the CD variations that would occur due to a shift of the effective light source distribution at the off-axis position from the effective light source distribution at the on-axis position on the surface to be illuminated, an amplitude of the periodic fine patterned part of the aperture stop 51 may be set to D/2 or greater. Since the effective light source distribution has discreteness at a period corresponding to the period of the secondary light source formed by the optical integrator 10, an amplitude of the fine patterned part may be equal to or greater than the period of the secondary light source formed by the optical integrator 10.

The opening part 51a of the aperture stop 51 is optimized to the pattern of the mask. The optimization usually weights only the opening part 51a and the light shielding part 51b for calculational simplicity, and it is thus effective that the patterned part 51c has a minimum width that maintains the imaging performance as optimal as possible. More specifically, the amplitude of the patterned part 51c needs to be equal to or smaller than a length that is five times as long as the period of the secondary light source formed by the optical integrator 10. In this respect, Japanese Patent Laid-Open No. 5-315226 that secures the light attenuation part as wide as possible is likely to deteriorate the optimized imaging performance, and the aperture stop 51 of this embodiment is different from Japanese Patent Laid-Open No. 5-315226.

In summary, it is necessary that an amplitude of the patterned part 51c ranges from the wavefront splitting period of the optical integrator 10 or a value of Z×tan(arcsin($\alpha$))/2 to a length that is five periods of the wavefront splitting period of the optical integrator 10.

Since the scanning exposure apparatus configured to synchronously scan the mask stage RS and the substrate stage WS and to provide exposures exposes the surface to be illuminated TP accumulatively exposed in the scanning direction (Y-axis direction), the effective light source distribution at the on-axis position and that at the off-axis position are accumulated and averaged in the scanning direction. Since a difference of the effective light source distribution in the scanning direction between the on-axis position and the off-axis position is not problematic, the patterned part 51c of the aperture stop 51 may be formed in at least part of the opening part 51a in the (X-axis) direction orthogonal to the scanning direction.

This embodiment can form a substantial light attenuation part between the opening part 51a and the light shielding part 51b by forming a fine patterned part at the boundary between the opening part 51a and the light shielding part 51b of the aperture stop 51. Hence, the patterned part 51c does not need a perfect periodicity and an approximately similar shape may be approximately periodically arranged. In addition, a period of the fine patterned part may be changed in accordance with a predetermined function.

A semiconductor device is manufactured by the step of exposing a substrate, such as a wafer and a glass plate, on which a photosensitive agent is applied by using the exposure apparatus of one of the above embodiments, the step of developing the substrate, and the other well-known step.

The present invention can provide an exposure apparatus and an aperture stop manufacturing method that decreases nonuniformity of a critical dimension of a mask pattern formed on a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-156075, filed Jun. 16, 2008, which is hereby incorporated by reference herein in its entirety.

What is claimed is:

1. An exposure apparatus comprising:
   an illumination optical system configured to illuminate a mask;
   a projection optical system configured to project an image of a pattern of the mask onto a substrate;
   a wavefront splitting device configured to form a secondary light source at a position conjugate with a pupil plane in the projection optical system; and
   an aperture stop arranged at a position that is shifted from a focal plane on an exit side of the wavefront splitting device,
   wherein the aperture stop includes a light shielding part, an opening part, and a light attenuation part that is located between the light shielding part and the opening part, and has a transmittance larger than that of the light shielding part and smaller than that of the opening part, and
   wherein a width of the light attenuation part is set within a range from a wavefront splitting period of the wavefront splitting device or a value of Z×tan(arcsin($\alpha$))/2 to a length that is five times as long as the wavefront splitting period of the wavefront splitting device, where $\alpha$ is a numerical aperture on an exit side of the wavefront splitting device, and Z is a distance between the focal plane of the wavefront splitting device on the exit side and the aperture stop.

2. An exposure apparatus according to claim 1, wherein the light attenuation part includes a thin film.

3. An exposure apparatus according to claim 1, wherein the light attenuation part includes a light attenuation filter.

4. An exposure apparatus according to claim 1, wherein the exposure apparatus exposes the pattern of the mask onto the substrate by scanning the mask and the substrate in a scanning direction, and
   wherein the light attenuation part is provided in a range that has an absolute value from 0° to 45° of an angle that is formed between the scanning direction and a tangent of a boundary between the opening part and the light shielding part.

5. An exposure apparatus according to claim 1, wherein the longest length of the opening part in a radial direction is equal to or smaller than a length that is fifteen times as long as the wavefront splitting period of the wavefront splitting device.

6. An exposure apparatus according to claim 1, wherein the opening part provides an off-axis illumination having two or more poles.

7. An exposure apparatus comprising:
   an illumination optical system configured to illuminate a mask;
   a projection optical system configured to project an image of a pattern of the mask onto a substrate;
   a wavefront splitting device configured to form a secondary light source at a position conjugate with a pupil plane that determines a numerical aperture in the projection optical system; and
   an aperture stop arranged at a position that is shifted from a focal plane on an exit side of the wavefront splitting device,
   wherein the aperture stop includes a light shielding part, an opening part, and a patterned part that is located at a boundary between the light shielding part and the opening part, and has a transmittance larger than that of the light shielding part and smaller than that of the opening part,
   wherein an amplitude of the patterned part is set within a range from a wavefront splitting period of the wavefront splitting device or a value of Z×tan(arcsin($\alpha$))/2 to a length that is five times as long as the wavefront splitting period of the wavefront splitting device, where $\alpha$ is a numerical aperture on an exit side of the wavefront splitting device, and Z is a distance between the focal plane of the wavefront splitting device on the exit side and the aperture stop.

8. An exposure apparatus according to claim 7, wherein the patterned part includes at least one of a serrated pattern, a corrugated pattern, and a pattern having a set of a plurality of holes.

9. A device manufacturing method comprising the steps of:
exposing a pattern of a mask onto a substrate using an exposure apparatus that includes an illumination optical system configured to illuminate a mask, a projection optical system configured to project an image of a pattern of the mask onto a substrate, a wavefront splitting device configured to form a secondary light source at a position conjugate with a pupil plane in the projection optical system, and an aperture stop arranged at a position that is shifted from a focal plane on an exit side of the wavefront splitting device; and
developing an exposure substrate,
wherein the aperture stop includes a light shielding part, an opening part, and a light attenuation part that is located between the light shielding part and the opening part, and has a transmittance larger than that of the light shielding part and smaller than that of the opening part, and
wherein a width of the light attenuation part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and $Z$ is a distance between the focal plane of the wavefront splitting device on the exit side and the aperture stop.

10. A device manufacturing method comprising the steps of:
exposing a pattern of a mask onto a substrate using an exposure apparatus that includes an illumination optical system configured to illuminate a mask, a projection optical system configured to project an image of a pattern of the mask onto a substrate, a wavefront splitting device configured to form a secondary light source at a position conjugate with a pupil plane in the projection optical system, and an aperture stop arranged at a position that is shifted from a focal plane on an exit side of the wavefront splitting device; and
developing an exposure substrate,
wherein the aperture stop includes a light shielding part, an opening part, and a patterned part that is located at a boundary between the light shielding part and the opening part, and has a transmittance larger than that of the light shielding part and smaller than that of the opening part,
wherein an amplitude of the patterned part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and $Z$ is a distance between the focal plane of the wavefront splitting device on the exit side and the aperture stop.

11. A method for manufacturing an aperture stop used for an exposure apparatus that includes an illumination optical system configured to illuminate a mask, a projection optical system configured to project an image of a pattern of the mask onto a substrate, and a wavefront splitting device configured to form a secondary light source at a position conjugate with a pupil plane in the projection optical system, and arranged at a position that is shifted from a focal plane on an exit side of the wavefront splitting device, said method comprising the steps of:
providing the aperture stop with a light shielding part, an opening part, and a light attenuation part that is located between the light shielding part and the opening part, and has a transmittance larger than that of the light shielding part and smaller than that of the opening part;
determining a width of the light attenuation part using a wavefront splitting period of the wavefront splitting device, or a numerical aperture of the wavefront splitting device on the exit side and a distance between the aperture stop and the focal plane on the exit side of the wavefront splitting device; and
preparing the aperture stop that includes the light attenuation part having a determined width, the light shielding part, and the opening part.

12. An method according to claim 11, further comprising the steps of:
determining shapes of the light shielding part and the opening part based on the pattern of the mask;
calculating the influence degree which the light attenuation part provides on an imaging performance of the pattern using determined shape information of the light shielding part and the opening part; and
determining the width of the light attenuation part based on a calculated influence degree.

13. A method for manufacturing an aperture stop used for an exposure apparatus that includes an illumination optical system configured to illuminate a mask, a projection optical system configured to project an image of a pattern of the mask onto a substrate, and a wavefront splitting device configured to form a secondary light source at a position conjugate with a pupil plane in the projection optical system, and arranged at a position that is shifted from a focal plane on an exit side of the wavefront splitting device, said method comprising the steps of:
providing the aperture stop with a light shielding part, an opening part, and a patterned part that is located at a boundary between the light shielding part and the opening part, and has a transmittance larger than that of the light shielding part and smaller than that of the opening part;
determining an amplitude of the patterned part using a wavefront splitting period of the wavefront splitting device, or a numerical aperture of the wavefront splitting device on the exit side and a distance between the aperture stop and the focal plane on the exit side of the wavefront splitting device; and
preparing the aperture stop that includes the patterned part having a determined amplitude, the light shielding part, and the opening part.

14. An aperture stop used for an exposure apparatus that includes an illumination optical system configured to illuminate a mask, a projection optical system configured to project an image of a pattern of the mask onto a substrate, and a wavefront splitting device configured to form a secondary light source at a position conjugate with a pupil plane in the projection optical system, and arranged at a position that is shifted from a focal plane on an exit side of the wavefront splitting device, comprising:
a light shielding part, an opening part, and a light attenuation part that is located between the light shielding part and the opening part, and has a transmittance larger than that of the light shielding part and smaller than that of the opening part, wherein a width of the light attenuation part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and $Z$ is a distance between the focal plane of the wavefront splitting device on the exit side and the aperture stop.

15. An aperture stop used for an exposure apparatus that includes an illumination optical system configured to illuminate a mask, a projection optical system configured to project an image of a pattern of the mask onto a substrate, and a wavefront splitting device configured to form a secondary light source at a position conjugate with a pupil plane in the projection optical system, and arranged at a position that is shifted from a focal plane on an exit side of the wavefront splitting device, comprising:

a light shielding part, an opening part, and a patterned part that is located at a boundary between the light shielding part and the opening part, and has a transmittance larger than that of the light shielding part and smaller than that of the opening part, wherein an amplitude of the patterned part is set within a range from a wavefront splitting period of the wavefront splitting device or a value of $Z \times \tan(\arcsin(\alpha))/2$ to a length that is five times as long as the wavefront splitting period of the wavefront splitting device, where $\alpha$ is a numerical aperture on an exit side of the wavefront splitting device, and $Z$ is a distance between the focal plane of the wavefront splitting device on the exit side and the aperture stop.

\* \* \* \* \*